United States Patent
Guo et al.

(10) Patent No.: US 9,609,254 B2
(45) Date of Patent: Mar. 28, 2017

(54) COMPACT ROW DECODER WITH MULTIPLE VOLTAGE SUPPORT

(71) Applicants: Li Guo, San Jose, CA (US); Guangbin Zhang, Cupertino, CA (US)

(72) Inventors: Li Guo, San Jose, CA (US); Guangbin Zhang, Cupertino, CA (US)

(73) Assignee: CISTA SYSTEM CORP., Grand Cayman (KY)

( * ) Notice: Subject to any disclaimer, the term of this patent is extended or adjusted under 35 U.S.C. 154(b) by 229 days.

(21) Appl. No.: 14/538,772

(22) Filed: Nov. 11, 2014

(65) Prior Publication Data

US 2015/0189197 A1 Jul. 2, 2015

Related U.S. Application Data

(60) Provisional application No. 61/921,467, filed on Dec. 29, 2013.

(51) Int. Cl.
| | |
|---|---|
| *H04N 5/376* | (2011.01) |
| *H04N 3/14* | (2006.01) |
| *G11C 8/10* | (2006.01) |

(52) U.S. Cl.
CPC ............. *H04N 5/376* (2013.01); *G11C 8/10* (2013.01); *H04N 3/1512* (2013.01)

(58) Field of Classification Search
CPC .... H04N 3/1512; H04N 3/151; H04N 3/1575; H04N 5/374; H04N 5/376; H04N 5/3765; G11C 8/10
See application file for complete search history.

(56) References Cited

U.S. PATENT DOCUMENTS

| | | | | |
|---|---|---|---|---|
| 8,772,694 | B2* | 7/2014 | Sugano | H04N 5/3532 250/208.1 |
| 9,466,347 | B1* | 10/2016 | Pasotti | G11C 13/0028 |
| 2001/0005225 | A1* | 6/2001 | Clark | H04N 5/3454 348/302 |
| 2003/0193594 | A1* | 10/2003 | Tay | H04N 5/343 348/308 |

(Continued)

FOREIGN PATENT DOCUMENTS

JP 2008099158 A * 4/2008

*Primary Examiner* — John Villecco
(74) *Attorney, Agent, or Firm* — Guosheng Wang; United States Research and Patent Firm

(57) ABSTRACT

The present invention provides a compact row decoder with multiple voltage support. The row decoder may include a global driver and a plurality of row-level drivers. The global driver may include one or more voltage level shifters that are operable to provide multiple voltages required to drive each of the plurality of row-level drivers. The plurality of row-level drivers each may include only one voltage level shifter. In an example, the row-level driver includes an address decoder implemented in a digital domain providing an address selection signal, a voltage level shifter to convert the address selection signal to an analog domain, and a row driver receiving driving signals from the global driver. The row driver has no voltage level shifter contained therein. Thus, the row-level drivers and the row decoder may be very compact. The present invention further provides a CMOS image sensor including the row decoder and a method of operating the CMOS image sensor.

11 Claims, 5 Drawing Sheets

(56) References Cited

U.S. PATENT DOCUMENTS

| | | | |
|---|---|---|---|
| 2003/0193596 A1* | 10/2003 | Tecchiolli | H04N 5/3454 348/308 |
| 2004/0119863 A1* | 6/2004 | Cho | H04N 3/155 348/308 |
| 2005/0018062 A1* | 1/2005 | Chiang | H04N 5/23241 348/294 |
| 2007/0200816 A1* | 8/2007 | Taguchi | G09G 3/3688 345/100 |
| 2008/0043540 A1* | 2/2008 | Boemler | G11C 8/08 365/189.11 |
| 2008/0049112 A1 | 2/2008 | Lee | |
| 2009/0086049 A1* | 4/2009 | Fujita | H04N 3/1568 348/222.1 |
| 2009/0284512 A1* | 11/2009 | Fan | G09G 3/3696 345/211 |
| 2009/0302359 A1* | 12/2009 | Chen | H04N 5/3456 257/292 |
| 2010/0157670 A1* | 6/2010 | Chevallier | G11C 13/0007 365/185.2 |
| 2012/0008027 A1* | 1/2012 | Makino | H04N 5/347 348/296 |
| 2012/0112039 A1* | 5/2012 | Sugano | H04N 5/3532 250/208.1 |
| 2013/0001399 A1* | 1/2013 | Egawa | H04N 5/355 250/208.1 |
| 2013/0187027 A1* | 7/2013 | Qiao | H04N 5/2351 250/208.1 |
| 2013/0193305 A1* | 8/2013 | Xu | H04N 5/376 250/208.1 |
| 2014/0092285 A1* | 4/2014 | Moriyama | H04N 5/235 348/297 |
| 2015/0171749 A1* | 6/2015 | Guo | G05F 1/618 323/271 |
| 2015/0181147 A1* | 6/2015 | Luo | H04N 5/3741 348/308 |
| 2015/0264288 A1* | 9/2015 | Okamoto | H04N 5/376 250/208.1 |
| 2016/0276005 A1* | 9/2016 | Jung et al. | G11C 8/08 |
| 2016/0366360 A1* | 12/2016 | Okamoto | H04N 5/378 |

* cited by examiner

COMPACT ROW DECODER WITH MULTIPLE VOLTAGE SUPPORT

CROSS-REFERENCE TO RELATED U.S. APPLICATIONS

This application claims the benefit of U.S. Provisional Patent Application No. 61/921,467, filed Dec. 29, 2013, which is incorporated herein by reference in its entirety.

STATEMENT REGARDING FEDERALLY SPONSORED RESEARCH OR DEVELOPMENT

Not applicable.

NAMES OF PARTIES TO A JOINT RESEARCH AGREEMENT

Not applicable.

REFERENCE TO AN APPENDIX SUBMITTED ON COMPACT DISC

Not applicable.

FIELD OF THE INVENTION

The present invention generally relates to the technical field of Complementary Metal-Oxide Semiconductor (CMOS) image sensor, and more particularly, to CMOS image sensor having a compact row decoder with multiple voltage support.

BACKGROUND OF THE INVENTION

Consumer electronic products, for example, portable devices such as smart phones, pads, tablets, laptops and digital cameras, have been rapidly developed and commercialized. To function as a digital camera, these smart phones, pads, tablets and laptops are typically equipped with one or more camera modules to capture images or videos. Digital cameras and camera modules can sense light using a semiconductor sensor, a common example of which is Complementary Metal-Oxide Semiconductor (CMOS) image sensor.

A CMOS image sensor includes a 2D (two dimension) array of pixels arranged in rows and columns, and a row decoder to control operation of the pixels. The row decoder includes a plurality of row-level decoders, the number of which corresponds to the number of the pixel rows, and each row-level decoder may drive a respective row of pixels. The row-level driver often requires a plurality of high and low voltages for its operation. However, logic control signals are usually in a low voltage domain, which cannot serve directly as the required high and low voltages. To solve this problem, voltage level shifters are needed in each row-level decoder to drive the high and low voltages.

As the resolution of the CMOS in sensor is continuously improved, the number of the pixel rows included in the CMOS image sensor increases accordingly. As a result, more and more row-level decoders are deployed in the CMOS image sensor to drive the pixel rows. These tow-level decoders consume a significant portion of the layout area and increase the overall cost of the image sensor.

Therefore, there exists a need for a compact row decoder that is capable of providing multiple voltage support. Advantageously, the present invention provides a solution that can meet such a need. The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

SUMMARY OF THE INVENTION

One aspect of the present invention provides a compact row decoder with multiple voltage support. The row decoder comprises a plurality of row-level drivers configured to drive a plurality of rows of pixels; and a global driver comprising at least one global voltage level shifter that is operable to drive the plurality of row-level drivers. In an embodiment, the plurality of row-level drivers each comprises an address decoder and a row driver.

In an exemplary embodiment, a row decoder may include a global driver and a plurality of row-level drivers that correspond to a plurality of rows of pixels. The global driver may include one or more voltage level shifters that are operable to provide multiple voltages required to drive each of the plurality of row-level drivers. The plurality of row-level drivers may each include only one voltage level shifter.

In an example, each row-level driver may include an address decoder, a voltage level shifter and a row driver. The address decoder is implemented in a digital domain and operates to provide an address selection signal. The voltage level shifter may convert the address selection signal to an analog domain. The row driver may receive the converted address selection signal from the voltage level shifter and driving signals from the global driver. Although the row driver is implemented in the analog domain, it has no voltage level shifter contained therein. Thus, the row-level drivers and the row decoder may be very compact.

Another aspect of the invention provides a CMOS image sensor. The sensor comprises a plurality of rows of pixels and a row decoder. The row decoder comprises a plurality of row-level drivers configured to drive the plurality of rows of pixels; and a global driver comprising at least one global voltage level shifter that is operable to drive the plurality of row-level drivers.

Still another aspect of the present invention provides a method for operating a CMOS image sensor. The CMOS image sensor comprises a plurality of rows of pixels, a row decoder, and a global driver. The row decoder comprises a plurality of row-level drivers provided for the plurality of pixel rows, respectively. The method comprises a step of generating, by the global driver, voltages in an analog domain required for operation of the row-level drivers; and a step of providing the voltages in the analog domain from the global driver to the row-level drivers.

The above features and advantages and other features and advantages of the present invention are readily apparent from the following detailed description of the best modes for carrying out the invention when taken in connection with the accompanying drawings.

BRIEF DESCRIPTION OF THE SEVERAL VIEWS OF THE DRAWINGS

The present invention is illustrated by way of example, and not by way of limitation, in the figures of the accompanying drawings and in which like reference numerals refer to similar elements. All the figures are schematic and generally only show parts which are necessary in order to elucidate the invention. For simplicity and clarity of illustration, elements shown in the figures and discussed below have not necessarily been drawn to scale. Well-known structures and devices are shown in simplified form such as block diagrams in order to avoid unnecessarily obscuring the present invention. Other parts may be omitted or merely suggested.

DETAILED DESCRIPTION OF THE PREFERRED EMBODIMENT

In the following description, for the purposes of explanation, numerous specific details are set forth in order to provide a thorough understanding of the present invention. It is apparent, however, to one skilled in the art that the present invention may be practiced without these specific details or with an equivalent arrangement.

It is also to be understood that the terminology used herein is for the purpose of describing particular embodiments only, and is not intended to limit the scope of the invention. For example, when an element is referred to as being "on", "connected to", or "coupled to" another element, it can be directly on, connected or coupled to the other element or intervening elements may be present. In contrast, when an element is referred to as being "directly on", "directly connected to", or "directly coupled to" another element, there are no intervening elements present.

Unless otherwise defined, all terms (including technical and scientific terms) used herein have the same meaning as commonly understood by one of ordinary skill in the art to which this present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Below, respective embodiments will be described in details by reference to the accompanying drawings. Incidentally, in all the drawings for describing the embodiments, the elements having the same function are given the same reference signs and numerals, and a repeated description thereon is omitted. Further, in the following embodiments, a description on the same or similar portions will not be repeated unless otherwise required.

The compact row decoder of the present invention can significantly reduce the layout area thereof, when it provides multiple high and low voltage support. It also provides flexibility to add additional logic functions at low cost of the layout area.

Figure 1:
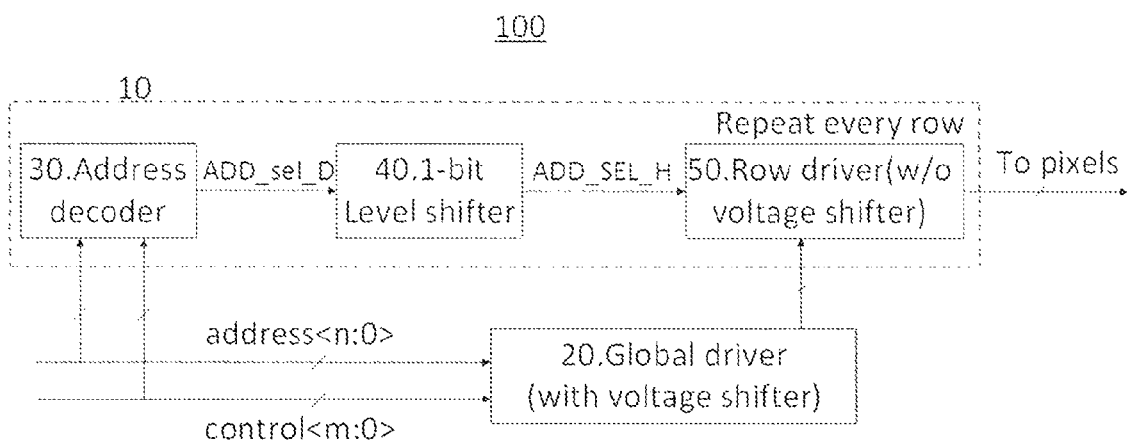
FIG. 1 is a block diagram schematically showing a row decoder in accordance with an exemplary embodiment of the present invention.

FIG. 1 is a high level block diagram showing a row decoder 100 in accordance with an exemplary embodiment of the present invention. Referring to FIG. 1, the row decoder 100 includes two main parts, i.e., a row level driver 10 and a global driver 20. Although not shown, there may be a plurality of row level drivers 10 that serve to drive a plurality of rows of pixels, respectively. Only one global driver 20 serves to drive the plurality of row level drivers 10.

Each of the row level drivers 10 may further contain two major sub-blocks, i.e., an address decoder 30 and a row driver 50. The address decoder 30 may be implemented in a digital domain, e.g., using a low voltage digital power supply and digital core Metal-Oxide Semiconductor Field Effect Transistors (MOSFETs). The row driver 50 may be implemented in an analog domain, which uses high and low voltage supplies as required. Since the address decoder 30 and the row driver 50 are included in the row level driver 10, they both are repetitively provided for the plurality of pixel rows, thereby costing a significant portion of the layout area.

In the embodiment, the high and low voltage supplies requited in the row driver 50 may be provided by the global driver 20. Specifically, the global driver 20 may include at least one global voltage level shifter (not shown) to convert driving signals from the digital domain to the required analog domain. Thus, the row driver 50 does not need any voltage level shifter contained therein. The row level drivers 10 may include only one low-to-high buffer, i.e., the voltage level shifter 40 connected between the address decoder 30 and the row driver 50 as shown in FIG. 1. The voltage level shifter 40 may convert a digital voltage to a highest swing control voltage, which will be discussed in more details later.

Although the at least one voltage level shifter circuit is still required in the global driver 20, and it needs relatively large buffers to drive all the row level driver circuits, it still costs much smaller layout area than putting the voltage level shifter into each row, because it only repeats one time, not as many times as the row level drivers 10 repeat. The low-to-high voltage level shifter 40, which may be a one-bit buffer provided in each of the plurality of row level drivers 10, costs some layout area, but it is much less than multiple in-row voltage level shifters that are otherwise provided in each row level driver 10. The address decoder 30 provided in each row level driver 10 uses a low voltage, which enables it to use the smallest digital MOSFETs. As a result, more complex address decoding logics can be implemented in this sub-block without adding a large layout area. Based on the above structures, the overall layout area of the row decoder 100 would be very compact.

Figure 2:
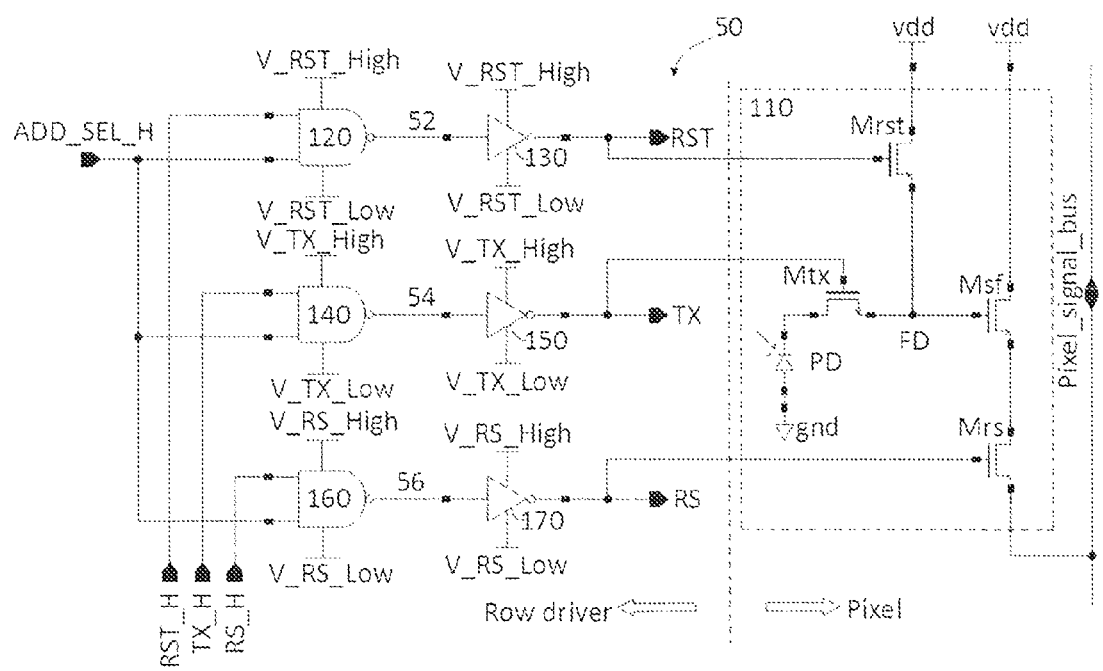
FIG. 2 depicts a circuit diagram for a row driver and a pixel coupled thereto in accordance with an exemplary embodiment of the present invention.

FIG. 2 illustrates a circuit diagram of the row driver 50 and one of the pixels 110 driven by the row driver 50, in accordance with an exemplary embodiment of the present invention. As a typical pixel for a CMOS image sensor, the pixel 110 has three major inputs, i.e., a reset signal RST, a transfer signal TX, and a row selection signal RS. Each input may require a high voltage and a low voltage. The row driver 50 may include three identical logic and driving structures for each of the three input signals, i.e., a channel 52 for the reset signal RST, a channel 54 for the transfer signal TX, and a channel 56 for the row selection signal RS.

Referring to FIG. 2, the channel 52 for the reset signal RST may include an AND gate 120 and an inverter 130. The AND gate 120 receives an address selection signal ADD_SEL_H, which has been converted by the voltage level shifter 40 to a highest swing control voltage, and a reset control signal RST_H provided from the global driver 20. The output of the AND gate 120 is connected to an input of the inverter 130. Thus, the channel 52 for the reset signal RST may determine the output signal RST on the basis of the address selection signal ADD_SEL_H and the reset control signal RST_H. The channel 54 for the transfer signal TX may include an AND gate 140 and an inverter 150. The AND gate 140 receives the address selection signal ADD_SEL_H and a transfer control signal TX_H provided from the global driver 20. The output of the AND gate 140 is connected to an input of the inverter 150. Thus, the channel 54 for the transfer signal TX may determine the output signal TX on the basis of the address selection signal ADD_SEL_H and the transfer control signal TX_H. The channel 56 for the row selection signal RS may include an AND gate 160 and an inverter 170. The AND gate 160 receives the address selection signal ADD_SEL$_{13}$ H and a row selection control signal RS_H provided from the global driver 20. The output of the AND gate 160 is connected to an input of the inverter 170. Thus, the channel 56 for the row selection signal RS may determine the output signal RS on the basis of the address selection signal ADD_SEL_H and the row selection control signal RS_H.

As shown in FIG. 2, when the address selection signal ADD_SEL_H is high, it means that this row of pixels is selected for access; when it is low, it means that this row of pixels is in a non-access status. The reset control signal RST_H, the transfer control signal TX_H and the row selection control signal RS_H may further determine only a portion of the time the pixels 110 in the row are accessible.

All the input signals, ADD_SEL_H, RST_H, TX_H, and RS_H, have already been converted to the highest swing voltage domain, and all the logic gates and inverters involved here, i.e., the AND gates 120, 140, 160 and the inverters 130, 150, 170, are powered by its related high and low voltages. The high voltages for V_RST_High, V_TX_High and V_RS_High may be the same or different, and the low voltages for V_RST_Low, V_TX_Low and V_RS_Low may be the same or different. In any condition, the input signals ADD_SEL_H, RST_H, and RS_H should have been converted to the highest voltage range, i.e., $$V\_input\_High=max(V\_RST\_High, V\_TX\_High, V\_RS\_High);$$

$$V\_input\_Low=min(V\_RST\_Low, V\_TX\_Low, V\_RS\_Low).$$

As can be seen, since all the input signals ADD_SEL_H, RST_H, and RS_H have been converted to the highest voltage range, the row driver 50 may not have any voltage level shifter contained therein. Thus, the layout area cost by the row driver 50 may be greatly reduced, especially considering that one row driver 50 is provided for each row of pixels. In addition, the address selection signal ADD_SEL_H, the reset control signal RST_H, the transfer control signal TX_H and the row selection control signal RS_H will be discussed in more detailing later.

Further referring to FIG. 2, the pixel 110 may operate with the reset signal RST, the transfer signal TX and the row selection signal RS. As shown, the pixel 110 may include a typical 4T (four transistor) structure, i.e., a transfer transistor Mtx, a rest transistor Mrst, a source-follower readout transistor Msf, and a row selection transistor Mrs. The pixel 110 may further include a photodetector such as a photodiode PD, and the photodiode PD may sense light and convert light into charges. When the transfer transistor Mtx turns on, the charges may be transferred to a floating diffusion (FD) region. The readout transistor Msf may act as an amplifier which allows the pixel voltage to be observed without removing the accumulated charges in the FD region. The row select transistor Mrs allows a single row of the pixel array to be read by the read-out electronics via the pixel signal bus. The reset transistor Mrst acts as a switch to reset the floating diffusion region. When the reset transistor turns on, the FD region is effectively connected to the power supply Vdd, clearing all accumulated charges.

It would be apparent that the present invention is not limited to any specific structure of the pixel 110 or the pixel array of the CMOS image sensor. The embodiments set forth here are also applicable to pixels having other structures, such as Noble 3T pixels and 5T or 6T pixels. The same effects may also be achieved in such pixels by applying the embodiments as disclosed here.

Figure 3:
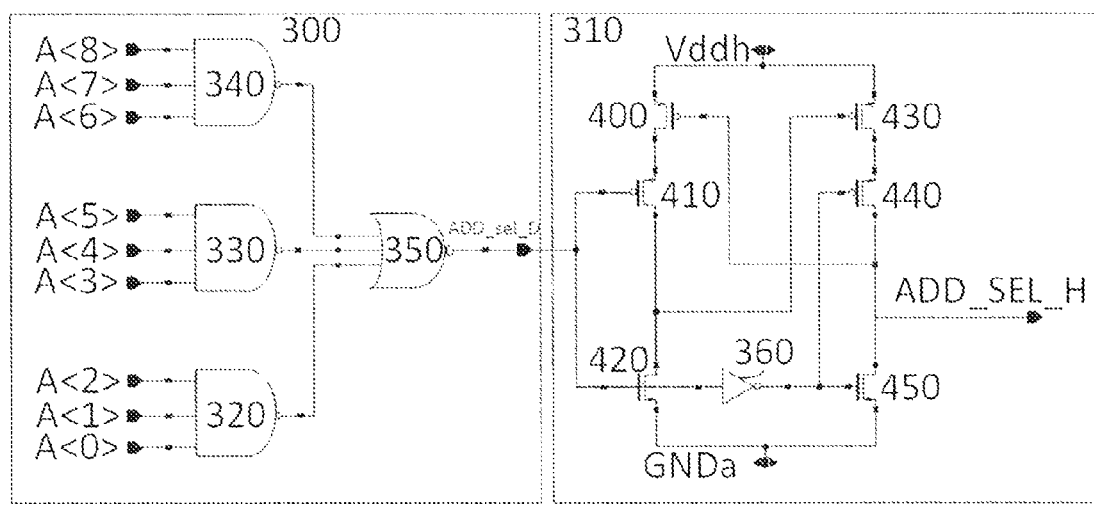
FIG. 3 is a circuit diagram for a row address decoder with a voltage level shifter in accordance with an exemplary embodiment of the present invention.

Referring now to FIG. 3, there shows a circuit diagram for a row address decoder 300 and a one-bit voltage level shifter 310 in accordance with an exemplary embodiment of the present invention. The row address decoder 300 may be used as the address decoder 30 as shown in FIG. 1, and the one-bit voltage level shifter 310 may be used as the voltage level shifter 40 as shown in FIG. 1.

As shown in FIG. 3, the row address decoder 300 may include digital logic gates 320, 330, 340 and 350. The logic gates 320, 330 and 340 may be NAND gates which have their inputs connected to the address lines A<n:0> (A<8:0> in this example), and the logic gate 350 may be a NOR gate which has its inputs connected to the outputs of the NAND gates 320, 330 and 340. It would be apparent that in other embodiments, the row address decoder 300 may include more or less digital logic gates, depending on the number of the rows included in the pixel array.

Only when all the address lines A<0> to A<n> are at a high level, the output of the NOR gate 350, i.e., the digital row selection signal ADD_sel_D, can be at a high level, which means the row that corresponds to the row address decoder 300 is selected for access. All the logic gates 320, 330, 340 and 350 included in the row address decoder 300 may use low voltage digital core MOSFETs, which occupy a very small layout area. Since the basis layout area is in a pure digital domain, it is also very easy to add additional row level logic functions, for example, adding a latch or additional logic elements, without adding a lot of layout area cost.

The digital signal ADD_sel_D may be provided from the row address decoder 300 to the input of the one-bit voltage level shifter 310, where it is converted to a high voltage range signal ADD_SEL_H that is high enough to drive the row driver circuit 50. Referring to FIG. 3, the one-bit voltage level shifter 310 may be implemented as a typical voltage level shifter circuit that includes a digital domain inverter 360 and a cross-coupled inverting pair composed of MOSFETs 400, 410, 420, 430, 440 and 450. Specifically, the PMOS transistor 400, the PMOS transistor 410 and the NMOS transistor 420 that are connected in series in this order are parallel with the PMOS transistor 430, the PMOS transistor 440 and the NMOS transistor 450 that are connected in series in this order between a power supply Vddh and the around GNDa. The gate of the PMOS transistor 400 is connected to a connecting point between the PMOS transistor 440 and the NMOS transistor 450, and a gate of the PMOS transistor 430 is connected to a connecting point between the PMOS transistor 410 and the NMOS transistor 420. The digital signal ADD_sel_D is provided to the gate of the PMOS transistor 410 and the NMOS transistor 420 and to the input of the inverter 360, and the output of the inverter 360 is provided to the gate of the PMOS transistor 440 and the NMOS transistor 450. The output signal ADD_SEL_H is extracted from the connecting point between the PMOS transistor 440 and the NMOS transistor 450.

The digital input signal ADD_sel_D goes into the digital domain inverter 360 first, and then the input and output of the inverter 360 drive the cross-coupled inverting pair 400-450 in a high voltage domain, thereby generating the output signal ADD_SEL_H. Thus, the address selection signal ADD_SEL_H has been converted to the highest swing control voltage by the voltage level shifter 310, and it becomes high enough to drive the row driver 50. It would be apparent that the voltage level shifter 310 may also use any other structures. Again, the address decoder 300 (or 30) is implemented in the digital domain, and it includes no voltage level shifter. Although the row driver 50 is implemented in the analog domain, it does not include any voltage level shifter either. As discussed below, the row driver 50 may acquire driving signals in the analog domain from the global driver 20. Therefore, the row level driver 10 may include only one voltage level shifter, i.e., the voltage level shifter 40 (or 310), and thus it may be built very compact.

Figure 4:
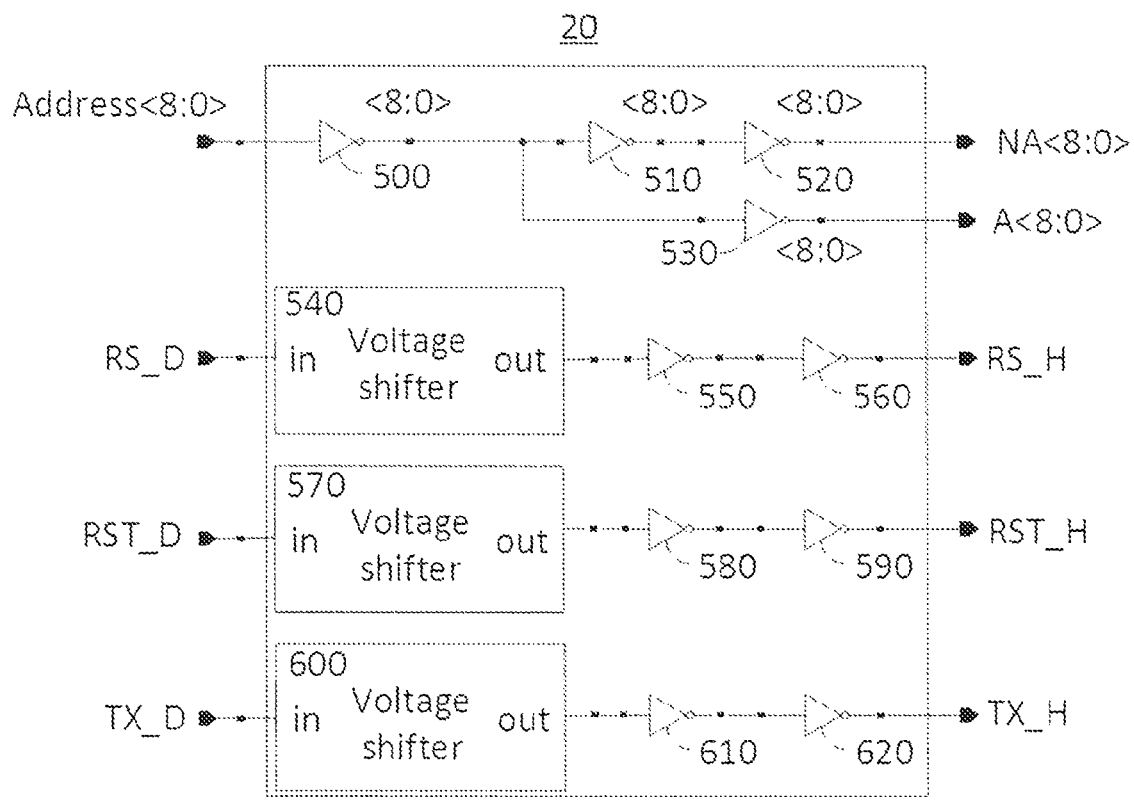
FIG. 4 shows a circuit diagram for a global driver with voltage level shifters in accordance with an exemplary embodiment of the present invention.

FIG. 4 shows a circuit diagram for the global driver 20 with voltage level shifters in accordance with an exemplary embodiment of the present invention. Again, the global driver 20 does not need to repeat as the row level driver 10 does. Referring to FIG. 4, the global driver 20 may include a plurality of digital voltage domain inverters 500, 510, 520 and 530 that form a driver for address signals Address<n:0> (Address<8:0> in this example). The plurality of digital voltage domain inverters 500, 520 and 530 convert the digital address signal Address<8:0> into complementary signals A<8:0> and NA<8:0> for easy connection in the row level address decoder 300. As discussed above, the address decoder 300 may be implemented in the pure digital domain, so there is no need to convert voltage domain for the address signals.

For other control signals RST_H, TX_H and RS_H, however, voltage conversion is necessary because the row driver 50 is implemented in the analog domain as disclosed above. Specifically, the global driver 20 may include a first global voltage level shifter 540, a second global voltage level shifter 570, and a third global voltage level shifter 600. An input signal RS_D, which is in a low voltage digital domain, firstly goes to the first global voltage level shifter 540 where it is converted to an RS_High/RS_Low domain. Then, the output from the first global voltage level shifter 540 passes through the inverters 550, 560 in an RS_High/RS_Low power supply domain to output the driving signal RS_H. The first global voltage level shifter 540 may use the same structure as the voltage level shifter 310 shown in FIG. 3, or any other suitable structures. Similarly, the other two signals RST_D and TX_D can utilize the same voltage level shifting and inverter buffering structure as the signal RS_D does. Referring to FIG. 4, the digital control signal RST_D may be processed in a channel composed of the second global voltage level shifter 570 and following inverters 580, 590, thereby generating the driving signal RST_H. The digital control signal TX_D may be processed in a channel composed of the third global voltage level shifter 600 and following inverters 610, 620, thereby generating the driving signal TX_D. Please note that the voltage level shifters 540, 570 and 600 may be in different voltage levels in different applications, or under different requirements. As such, the control signals have been converted from the digital domain to the analog domain when they are provided to drive the row driver 50. So, the row driver 50 does not need to include any voltage level shifter. In addition, due to the simple structure of the global driver 20 as described above, its layout size can be very small too.

Figure 5:
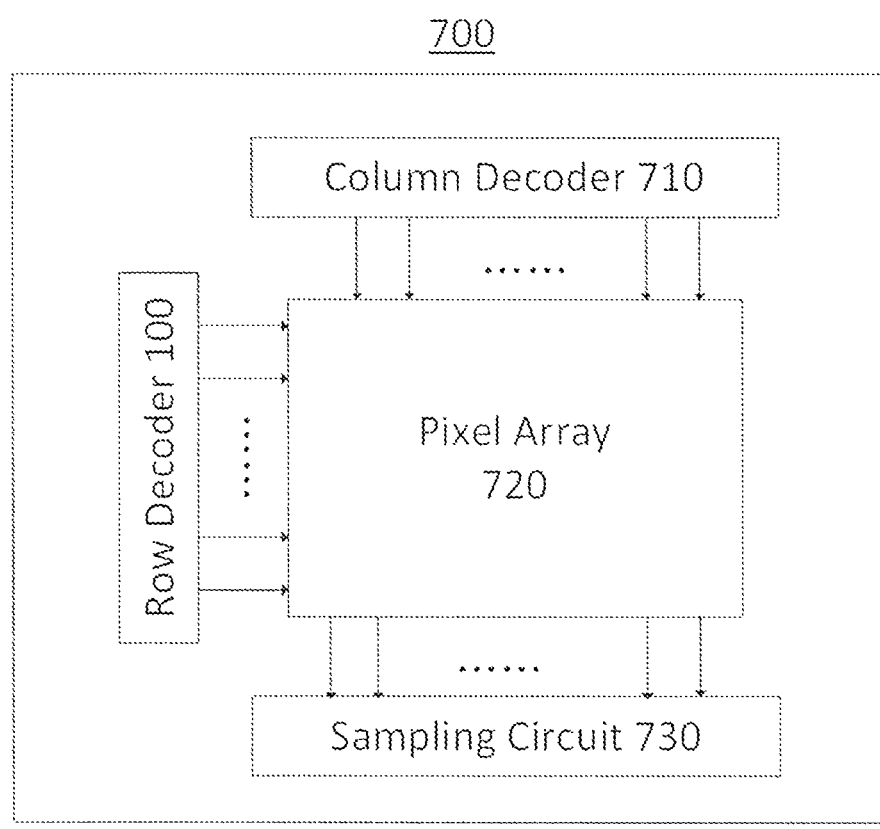
FIG. 5 is a block diagram showing a CMOS image sensor in which embodiments of the present invention may be implemented.

FIG. 5 depicts a block diagram showing a CMOS image sensor 700 in which embodiments of the present invention may be implemented. Referring to FIG. 5, the CMOS image sensor 700 may include a pixel array 720. The pixel array 720 may include a plurality of pixels arranged in rows and columns, and each of the plurality of pixels may be the same as or similar to the pixel 110 as shown in FIG. 2.

The pixel array 720 may be driven by the row decoder 100 as previously discussed with reference to FIGS. 1-4 and a column decoder 710, and an image signal generated by the pixel array 720 may be extracted by a sampling circuit 730 and be further processed by a processing circuit (not shown).

An embodiment for the method of operating the CMOS image sensor 700 will be described herein with reference to FIGS. 1-5. Specifically, the method may include generating, by the global driver 20, voltages in the analog domain required for operation of the plurality of row-level drivers 10, and providing the voltage in the analog domain from the global driver to the plurality of row-level drivers 10. In particular, the voltages in the analog domain may be used to drive the row driver 50 that is included in each of the row-level drivers 10. In an example, the voltages in the analog domain may be generated by one or more voltage level shifters converting the voltages from the digital domain to the analog domain. In such a case, the driving voltages required for the row driver 50 has been converted into the analog domain by the global driver 20 when they are provided to the row driver 50. The row-level driver 10 may include only one voltage level shifter 40 that converts the address selection signal ADD_sel_D in the digital domain provided from the address decoder 30 to the address selection signal ADD_SEL_H in the analog domain so that it can be used directly by the row driver 50. Consequently, the row driver 50 itself does not need any voltage level shifter.

In the foregoing specification, embodiments of the present invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicant to be the scope of the invention, is the literal and equivalent scope of the set of claims that issue from this application, in the specific form in which such claims issue, including any subsequent correction.

The invention claimed is:

1. A row decoder, comprising:
   a plurality of row-level drivers configured to drive a plurality of rows of pixels; and
   a global driver comprising at least one global voltage level shifter that is operable to drive the plurality of row-level drivers;
   wherein each of the plurality of row-level drivers comprises an address decoder implemented in a digital domain, a row driver implemented in an analog domain, and only one row-level voltage level shifter connected between the address decoder and the row driver, and
   wherein said row driver has no voltage level shifter included therein.

2. The row decoder according to claim 1, wherein the at least one global voltage level shifter is configured to provide driving signals in an analog domain to the row driver.

3. The row decoder according to claim 1, wherein the row-level voltage level shifter is configured to convert a row access signal from a digital domain to an analog domain.

4. The row decoder according to claim 1, wherein the at least one global voltage level shifter further comprises:
- a first global voltage level shifter configured to convert a reset control signal from a digital domain to an analog domain;
- a second global voltage level shifter configured to convert a transfer control signal from the digital domain to the analog domain; and
- a third global voltage level shifter configured to convert a row selection control signal from the digital domain to the analog domain,
- wherein the reset control signal, the transfer control signal and the row selection control signal in the analog domain are provided to the row driver.

5. The row decoder according to claim 4, wherein the row driver comprises:
- a reset channel configured to receive the reset control signal and generate a reset signal for a reset operation of a pixel;
- a transfer channel configured to receive the transfer control signal and generate a transfer signal for a charge transfer operation of a pixel; and
- a read channel configured to receive the row selection control signal and generate a row selection signal for a read operation of a pixel.

6. A CMOS image sensor, comprising a plurality of rows of pixels; and a row decoder, wherein the row decoder comprises
- a plurality of row-level drivers configured to drive the plurality of rows of pixels; and
- a global driver comprising at least one global voltage level shifter that is operable to drive the plurality of row-level drivers;
- wherein each of the plurality of row-level drivers comprises an address decoder implemented in a digital domain, a row driver implemented in an analog domain, and only one row-level voltage level shifter connected between the address decoder and the row driver; and
- wherein said row driver has no voltage level shifter included therein.

7. A method for operating a CMOS image sensor of claim 6 comprising:
- generating, by the global driver, voltages in an analog domain required for operation of the row-level drivers; and
- providing the voltages in the analog domain from the global driver to the row-level drivers.

8. The method according to claim 7, wherein the step of providing the voltages comprises providing the voltages in the analog domain to the row driver.

9. The method according to claim 8, wherein the step of generating the voltages comprises converting, by at least one voltage level shifter included in the global driver, the voltages from the digital domain to the analog domain.

10. The method according to claim 8, further comprising:
- generating, by the address decoder, a row access signal in the digital domain; and
- converting, by the row-level voltage level shifter connected between the address decoder and the row driver, the row access signal from the digital domain to the analog domain.

11. The method according to claim 8, wherein the plurality of row-level drivers each comprise only one voltage level shifter.

* * * * *